(12) United States Patent
Tipirneni et al.

(10) Patent No.: US 9,508,596 B2
(45) Date of Patent: Nov. 29, 2016

(54) PROCESSES USED IN FABRICATING A METAL-INSULATOR-SEMICONDUCTOR FIELD EFFECT TRANSISTOR

(71) Applicant: Vishay-Siliconix, Santa Clara, CA (US)

(72) Inventors: Naveen Tipirneni, Santa Clara, CA (US); Deva Pattanayak, Saratoga, CA (US)

(73) Assignee: Vishay-Siliconix, Santa Clara, CA (US)

( * ) Notice: Subject to any disclaimer, the term of this patent is extended or adjusted under 35 U.S.C. 154(b) by 0 days.

(21) Appl. No.: 14/311,165

(22) Filed: Jun. 20, 2014

(65) Prior Publication Data

US 2015/0372077 A1   Dec. 24, 2015

(51) Int. Cl.
H01L 21/8234 (2006.01)
H01L 29/78 (2006.01)

(52) U.S. Cl.
CPC ....... *H01L 21/8234* (2013.01); *H01L 29/7811* (2013.01); *H01L 29/7823* (2013.01)

(58) Field of Classification Search
CPC ........... H01L 21/8234; H01L 21/0634; H01L 29/7823
See application file for complete search history.

(56) References Cited

U.S. PATENT DOCUMENTS

| | | | |
|---|---|---|---|
| 4,191,603 A | 3/1980 | Garbarino et al. | |
| 4,375,999 A | 3/1983 | Nawata et al. | |
| 4,399,449 A | 8/1983 | Herman et al. | |
| 4,532,534 A | 7/1985 | Ford et al. | |
| 4,584,025 A | 4/1986 | Takaoka et al. | |
| 4,593,302 A | 6/1986 | Lidow et al. | |
| 4,602,266 A | 7/1986 | Coe | |
| 4,620,211 A | 10/1986 | Baliga et al. | |
| 4,646,117 A | 2/1987 | Temple | |
| 4,680,853 A | 7/1987 | Lidow et al. | |
| 4,710,265 A | 12/1987 | Hotta | |
| 4,803,532 A | 2/1989 | Mihara | |
| 4,819,044 A | 4/1989 | Murakami | |

(Continued)

FOREIGN PATENT DOCUMENTS

| | | |
|---|---|---|
| DE | 3932621 | 4/1990 |
| DE | 10343084 | 5/2005 |

(Continued)

OTHER PUBLICATIONS

Takemura, et al., "BSA Technology for Sub-100nm Deep Base Bipolar Transistors", Int'l Elec. Devs. Meeting, 1987, pp, 375-378. Jan.

(Continued)

*Primary Examiner* — Allan R Wilson

(57) ABSTRACT

During fabrication, a second oxide layer is disposed over a first region and a second region of a structure. The second region includes a first oxide layer between the second oxide layer and an epitaxial layer. The first region corresponds to an active region of a metal-insulator-semiconductor field effect transistor (MISFET), and a first-type dopant source region, a second-type dopant body region, and a second-type dopant implant region are formed in the first region. The second region corresponds to a termination region of the MISFET. A mask is formed over the second region, and parts of the second oxide layer and the first oxide layer that are exposed through the gaps are removed, thereby exposing the epitaxial layer. Second-type dopant is deposited into the epitaxial layer through the resultant openings in the first and second oxide layers, thereby forming field rings for the MISFET.

18 Claims, 8 Drawing Sheets

(56) References Cited

U.S. PATENT DOCUMENTS

| | | | |
|---|---|---|---|
| 4,819,052 A | 4/1989 | Hutter | |
| 4,941,026 A | 7/1990 | Temple | |
| 4,954,854 A | 9/1990 | Dhong et al. | |
| 4,974,059 A | 11/1990 | Kinzer | |
| 4,982,249 A | 1/1991 | Kim et al. | |
| 5,016,066 A | 5/1991 | Takahashi | |
| 5,019,526 A | 5/1991 | Yamane et al. | |
| 5,034,338 A | 7/1991 | Neppl et al. | |
| 5,034,346 A | 7/1991 | Alter et al. | |
| 5,072,266 A | 12/1991 | Bulucea et al. | |
| 5,086,007 A | 2/1992 | Ueno | |
| 5,087,577 A | 2/1992 | Strack | |
| 5,156,993 A | 10/1992 | Su | |
| 5,160,491 A | 11/1992 | Mori | |
| 5,168,331 A | 12/1992 | Yilmaz | |
| 5,171,699 A | 12/1992 | Hutter et al. | |
| 5,233,215 A | 8/1993 | Baliga | |
| 5,250,449 A | 10/1993 | Kuroyanagi et al. | |
| 5,268,586 A | 12/1993 | Mukherjee et al. | |
| 5,298,442 A | 3/1994 | Bulucea et al. | |
| 5,316,959 A | 5/1994 | Kwan et al. | |
| 5,341,011 A | 8/1994 | Hshieh et al. | |
| 5,362,665 A | 11/1994 | Lu | |
| 5,378,655 A | 1/1995 | Hutchings et al. | |
| 5,396,085 A | 3/1995 | Baliga | |
| 5,404,040 A | 4/1995 | Hshieh et al. | |
| 5,422,508 A | 6/1995 | Yilmaz et al. | |
| 5,429,964 A | 7/1995 | Yilmaz et al. | |
| 5,474,946 A | 12/1995 | Ajit et al. | |
| 5,497,013 A | 3/1996 | Temple | |
| 5,521,409 A | 5/1996 | Hshieh et al. | |
| 5,578,508 A | 11/1996 | Baba et al. | |
| 5,597,765 A | 1/1997 | Yilmaz et al. | |
| 5,614,751 A | 3/1997 | Yilmaz et al. | |
| 5,637,898 A | 6/1997 | Baliga | |
| 6,162,695 A | 12/2000 | Hwang et al. | |
| 6,228,700 B1 | 5/2001 | Lee | |
| 6,274,904 B1 | 8/2001 | Tihanyi | |
| 6,285,060 B1 | 9/2001 | Korec et al. | |
| 6,445,054 B1 | 9/2002 | Traijkovic et al. | |
| 6,465,843 B1 | 10/2002 | Hirler et al. | |
| 6,489,204 B1 | 12/2002 | Tsui | |
| 6,794,239 B2 | 9/2004 | Gonzalez | |
| 6,831,345 B2 | 12/2004 | Kinoshita et al. | |
| 6,906,380 B1 | 6/2005 | Pattanayak et al. | |
| 6,927,451 B1 | 8/2005 | Darwish | |
| 7,045,857 B2 | 5/2006 | Darwish et al. | |
| 7,122,875 B2 | 10/2006 | Hatade | |
| 7,224,022 B2 | 5/2007 | Tokano et al. | |
| 7,335,946 B1 | 2/2008 | Bhalla et al. | |
| 7,348,235 B2 | 3/2008 | Fujiishi | |
| 7,449,354 B2 | 11/2008 | Marchant et al. | |
| 7,504,307 B2 | 3/2009 | Peake | |
| 7,704,864 B2 | 4/2010 | Hshieh | |
| 7,745,883 B2 | 6/2010 | Williams et al. | |
| 7,759,204 B2* | 7/2010 | Hshieh et al. | 438/296 |
| 7,910,486 B2 | 3/2011 | Yilmaz et al. | |
| 7,960,786 B2* | 6/2011 | Huang et al. | 257/341 |
| 7,964,913 B2 | 6/2011 | Darwish | |
| 8,076,718 B2 | 12/2011 | Takaya et al. | |
| 8,344,457 B2* | 1/2013 | Noguchi et al. | 257/355 |
| 8,350,325 B2* | 1/2013 | Tamaki et al. | 257/341 |
| 8,432,000 B2* | 4/2013 | Grebs | 257/374 |
| 8,802,529 B2* | 8/2014 | Yilmaz et al. | 438/270 |
| 8,803,207 B2 | 8/2014 | Grebs et al. | |
| 9,082,845 B1* | 7/2015 | Seok | |
| 2001/0026989 A1 | 10/2001 | Thapar | |
| 2001/0050394 A1 | 12/2001 | Onishi et al. | |
| 2002/0016034 A1 | 2/2002 | Gonzalez | |
| 2002/0030237 A1 | 3/2002 | Omura et al. | |
| 2002/0123196 A1 | 9/2002 | Chang et al. | |
| 2003/0011046 A1 | 1/2003 | Qu | |
| 2003/0085422 A1 | 5/2003 | Amali et al. | |
| 2003/0193067 A1 | 10/2003 | Kim et al. | |
| 2004/0021173 A1 | 2/2004 | Sapp | |
| 2004/0021174 A1 | 2/2004 | Kobayashi | |
| 2004/0113201 A1 | 6/2004 | Bhalla et al. | |
| 2004/0222458 A1 | 11/2004 | Hsieh et al. | |
| 2004/0222461 A1 | 11/2004 | Peyre-Lavigne et al. | |
| 2005/0035401 A1 | 2/2005 | Yamaguchi | |
| 2005/0215011 A1 | 9/2005 | Darwish et al. | |
| 2005/0242392 A1 | 11/2005 | Pattanayak et al. | |
| 2006/0014349 A1 | 1/2006 | Williams et al. | |
| 2006/0209887 A1 | 9/2006 | Bhalla et al. | |
| 2006/0214242 A1 | 9/2006 | Carta et al. | |
| 2006/0246650 A1 | 11/2006 | Williams et al. | |
| 2006/0267090 A1 | 11/2006 | Sapp et al. | |
| 2006/0273390 A1 | 12/2006 | Hshieh et al. | |
| 2007/0040217 A1 | 2/2007 | Saito et al. | |
| 2007/0108515 A1 | 5/2007 | Hueting et al. | |
| 2007/0155104 A1 | 7/2007 | Marchant et al. | |
| 2008/0042172 A1 | 2/2008 | Hirler et al. | |
| 2008/0073707 A1 | 3/2008 | Darwish | |
| 2008/0079078 A1* | 4/2008 | Noguchi et al. | 257/355 |
| 2008/0090347 A1 | 4/2008 | Huang et al. | |
| 2008/0166845 A1 | 7/2008 | Darwish | |
| 2008/0197407 A1 | 8/2008 | Challa et al. | |
| 2008/0211020 A1 | 9/2008 | Saito | |
| 2008/0246081 A1 | 10/2008 | Li | |
| 2008/0290403 A1 | 11/2008 | Ono et al. | |
| 2009/0020810 A1 | 1/2009 | Marchant | |
| 2009/0079002 A1 | 3/2009 | Lee et al. | |
| 2009/0085099 A1 | 4/2009 | Su et al. | |
| 2009/0085541 A1* | 4/2009 | Jang | 323/282 |
| 2009/0090967 A1 | 4/2009 | Chen et al. | |
| 2009/0206440 A1 | 8/2009 | Schulze et al. | |
| 2009/0315104 A1 | 12/2009 | Hsieh | |
| 2010/0006935 A1 | 1/2010 | Huang et al. | |
| 2010/0078775 A1 | 4/2010 | Mauder et al. | |
| 2010/0264486 A1 | 10/2010 | Denison et al. | |
| 2010/0289032 A1 | 11/2010 | Zhang et al. | |
| 2010/0311216 A1 | 12/2010 | Marchant | |
| 2011/0001189 A1 | 1/2011 | Challa et al. | |
| 2001/0095359 | 4/2011 | Tipirneni | |
| 2011/0089486 A1 | 4/2011 | Xu et al. | |
| 2011/0089488 A1 | 4/2011 | Yilmaz et al. | |
| 2011/0193158 A1 | 8/2011 | Anderson et al. | |
| 2011/0233667 A1 | 9/2011 | Tai et al. | |
| 2011/0284953 A1 | 11/2011 | Long et al. | |
| 2012/0032258 A1 | 2/2012 | Zeng et al. | |
| 2012/0061753 A1 | 3/2012 | Nishiwaki | |
| 2012/0319199 A1 | 12/2012 | Zeng et al. | |
| 2013/0140633 A1 | 6/2013 | Pattanayak | |
| 2013/0207172 A1* | 8/2013 | Hsieh | 257/315 |
| 2013/0207227 A1 | 8/2013 | Azam et al. | |
| 2013/0214355 A1 | 8/2013 | Fang et al. | |
| 2013/0320462 A1* | 12/2013 | Tipirneni et al. | 257/409 |
| 2014/0332919 A1* | 11/2014 | Guan et al. | 257/487 |
| 2014/0346593 A1* | 11/2014 | Hsieh | H01L 29/7813 257/334 |

FOREIGN PATENT DOCUMENTS

| | | |
|---|---|---|
| DE | 112006003618 T5 | 11/2008 |
| EP | 0227894 | 7/1987 |
| EP | 0279403 A2 | 8/1988 |
| EP | 0310047 A2 | 4/1989 |
| EP | 0345380 | 12/1989 |
| EP | 0580213 | 1/1994 |
| EP | 0583023 | 2/1994 |
| EP | 0 620 588 | 10/1994 |
| FR | 2647596 | 11/1990 |
| GB | 2033658 | 5/1980 |
| GB | 2087648 | 5/1982 |
| GB | 2134705 | 8/1984 |
| GB | 2137811 | 10/1984 |
| GB | 2166290 | 4/1986 |
| JP | 56-58267 | 5/1981 |
| JP | 59-84474 | 5/1984 |
| JP | 59-141267 | 8/1984 |
| JP | 20-249367 | 12/1985 |
| JP | 61-80860 | 4/1986 |

(56) References Cited

FOREIGN PATENT DOCUMENTS

| | | |
|---|---|---|
| JP | 62-176168 | 8/1987 |
| JP | 1-42177 | 2/1989 |
| JP | 1-198076 | 8/1989 |
| JP | 1-310576 | 12/1989 |
| JP | 2-91976 | 3/1990 |
| JP | 2002033479 A * | 1/2002 |
| JP | 3273180 | 4/2002 |
| JP | 2002-540603 | 11/2002 |
| JP | 2003-101039 A | 4/2003 |
| JP | 2003-179223 | 6/2003 |
| JP | 2005-209983 A | 8/2005 |
| JP | 2005-286328 | 10/2005 |
| JP | 2006-128507 | 5/2006 |
| JP | 2006-310782 | 11/2006 |
| JP | 2007-157799 | 6/2007 |
| KR | 110-2012-0027299 A | 3/2012 |
| WO | 2006027739 | 3/2006 |
| WO | 2007002857 | 1/2007 |

OTHER PUBLICATIONS

S.C. Sun, et al., "Modeling of the On-Resistance of LDMOS, VDMOS and VMOS Power Transistors", IEEE Trans. Electron Devices, vol. ED-27, No. 2, Feb. 1980, pp. 356-367.

P. Ou-Yang, "Double Ion Implanted V-Mos Technology", IEEE Journal of Solid State Circuits, vol. SC-12, No. 1, Feb. 1977, pp. 3-10.

D. Juame, et al., "High-Voltage Planar Devices Using Filed Plate and Semi-Resistive Layers", IEEE Trans. on Electron Devices, vol. 38, No. 7, Jul. 1991, pp. 1681-1684.

Baliga, "Modem Power Devices", A Wiley-Interscience Publication, John Wiley & Sons, Inc., 1987, pp. 62-131.

Barbuscia, et al., "Modeling of Polysilicon Dopant Diffusion for Shallow-Junction Bipolar Technology", IEDM, 1984, pp. 757-760, No Month.

K. Shenai, et al., "Optimum Low-Voltage Silicon Power Switches Fabricated Using Sclaed Trench MOS Technologies", IEEE, International Electron Devices Meeting, Dec. 9, 1990, San Francisco, USA, pp. 793-797.

Antognetti, "Power Integrated Circuits: Physics, Design, and Applications", McGraw-Hill Book Co., 1986, pp. 114-3.27, Dec.

"SMP6ON06, 60N05, SMP5ON06, 50N05, N-Channel Enhancement Mode Transistors", Mospower Data Book, Siliconix Inc., 1988, pp. 4-423-4-426.

Hang, et al., "Vertical FET Random-Access Memories With Deep Trench Isolation", IBM Technical Disclosure Bulletin, vol. 22, No. 8B, Jan. 1980, pp. 3683-3687.

Patent Application as Filed for U.S. Appl. No. 14/663,872, Inventors: Misbah Ul Azam, et al., Filed Mar. 20, 2015; "MOSFET Termination Trench".

* cited by examiner

PROCESSES USED IN FABRICATING A METAL-INSULATOR-SEMICONDUCTOR FIELD EFFECT TRANSISTOR

BACKGROUND

The manufacture of a metal-insulator-semiconductor field effect transistor (MISFET) device (e.g., a metal-oxide-semiconductor field effect transistor (MOSFET)) includes a number of critical photolithographic masking and alignment processes/steps.

U.S. Pat. No. 5,302,537 discusses the use of three mask processes for fabricating the active cell region and the termination region of a low-voltage MISFET. However, the processes described in that patent are inadequate for building a reliable high-voltage (greater than 80 volts (V)) device.

Field or termination rings that terminate the planar junction of the active cell region are commonly used to achieve a high-voltage device. U.S. Pat. No. 5,795,793 discusses the use of three mask processes for fabricating the active region of a MOSFET. An additional three masks are needed to form the termination rings, meaning at least six masks are needed to manufacture a high-voltage device.

Reducing the number of masks needed to manufacture a high-voltage device can decrease manufacturing costs and increase yield.

SUMMARY

Embodiments according to the present invention pertain to processes used in fabricating a metal-insulator-semiconductor field effect transistor (MISFET), in particular a high-voltage (e.g., greater than 80 V) MISFET, and also pertain to devices fabricated using such processes.

In an embodiment according to the invention, during fabrication of a MISFET (e.g., a MOSFET), a second oxide layer is disposed over a first region and a second region of a structure. The structure includes a semiconductor substrate with an n-type epitaxial layer. The first region corresponds to an active region of the MISFET, and the second region corresponds to a termination region of the MISFET. The second region includes a first oxide layer between the second oxide layer and an epitaxial layer. A first-type dopant source region, a second-type dopant body region, and a second-type dopant implant region are formed in the first region. A mask is formed over the second region, and parts of the second oxide layer and the first oxide layer in the second region that are exposed through gaps in the mask are removed, thereby exposing the epitaxial layer. Second-type dopant is deposited through the resultant openings in the first and second oxide layers into the epitaxial layer in the second region, thereby forming field rings for the MISFET.

More specifically, in one embodiment, a first oxide layer is deposited over an epitaxial layer of a structure. A first mask is formed over the first oxide layer. The first mask defines a second region corresponding to the termination region of the MISFET. The first oxide layer is removed from around the first mask to define a first region corresponding to the active region of the MISFET. After removing the first mask, a polysilicon layer is deposited over the first region and the second region. A second mask is formed over the polysilicon layer. The polysilicon layer is removed from around the second mask to form an opening in the polysilicon layer in the first region, thereby exposing the epitaxial layer. A first-type dopant source region, a second-type dopant body region, and a second-type dopant implant region are formed in the epitaxial layer through the opening.

After the second mask is removed, a second oxide layer is deposited over the first region and the second region. A third mask is formed over at least the second region. The third mask includes mask elements separated by gaps, and parts of the second oxide layer and the first oxide layer that are exposed through the gaps are removed, thereby exposing the epitaxial layer. Also, in the second region, second-type dopant is deposited through the resultant openings in the first and second oxide layers into the epitaxial layer, thereby forming field rings for the MISFET. After the third mask is removed, a metal layer is deposited over the first region and the second region. A fourth mask is formed over the metal layer, and the metal layer is removed from areas around the fourth mask. After the fourth mask is removed, a passivation layer is deposited over the first region and the second region. A fifth mask is formed over the passivation layer, and the passivation layer is removed from around the fifth mask to form source and gate bond pad regions for the MISFET.

In one embodiment, the gaps in the third mask are uniformly sized and uniformly spaced. In one such embodiment, each of the gaps is between approximately 0.5 and 0.8 microns in width, and each of the mask elements has a width of approximately 1.8 microns.

In one embodiment, the third mask also includes mask elements over the first region. These mask elements are separated by a gap. Parts of the second oxide layer and the first-type dopant source region that are exposed through that gap are removed, thereby also exposing the second-type dopant implant region.

In summary, in embodiments according to the invention, five masks/mask steps are used. Generally speaking, the number of masks is reduced relative to conventional processes, from six masks to five masks, thus reducing manufacturing costs and increasing yield.

These and other objects and advantages of embodiments according to the present invention will be recognized by one skilled in the art after having read the following detailed description, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention. Like numbers denote like elements throughout the drawings and specification.

DETAILED DESCRIPTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

The figures are not drawn to scale, and only portions of the structures, as well as the various layers that form those structures, may be shown in the figures.

As used herein, the letter "n" refers to an n-type dopant and the letter "p" refers to a p-type dopant. A plus sign "+" or a minus sign "−" is used to represent, respectively, a relatively high or relatively low concentration of the dopant.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. The disclosure is presented in the context of an n-channel device, specifically an n-channel MISFET (e.g., a MOSFET); however, embodiments according to the present invention are not so limited. That is, the features described herein can be utilized in a p-channel device. The disclosure can be readily mapped to a p-channel device by substituting, in the discussion, n-type dopant and materials for corresponding p-type dopant and materials, and vice versa.

Figure 1A:
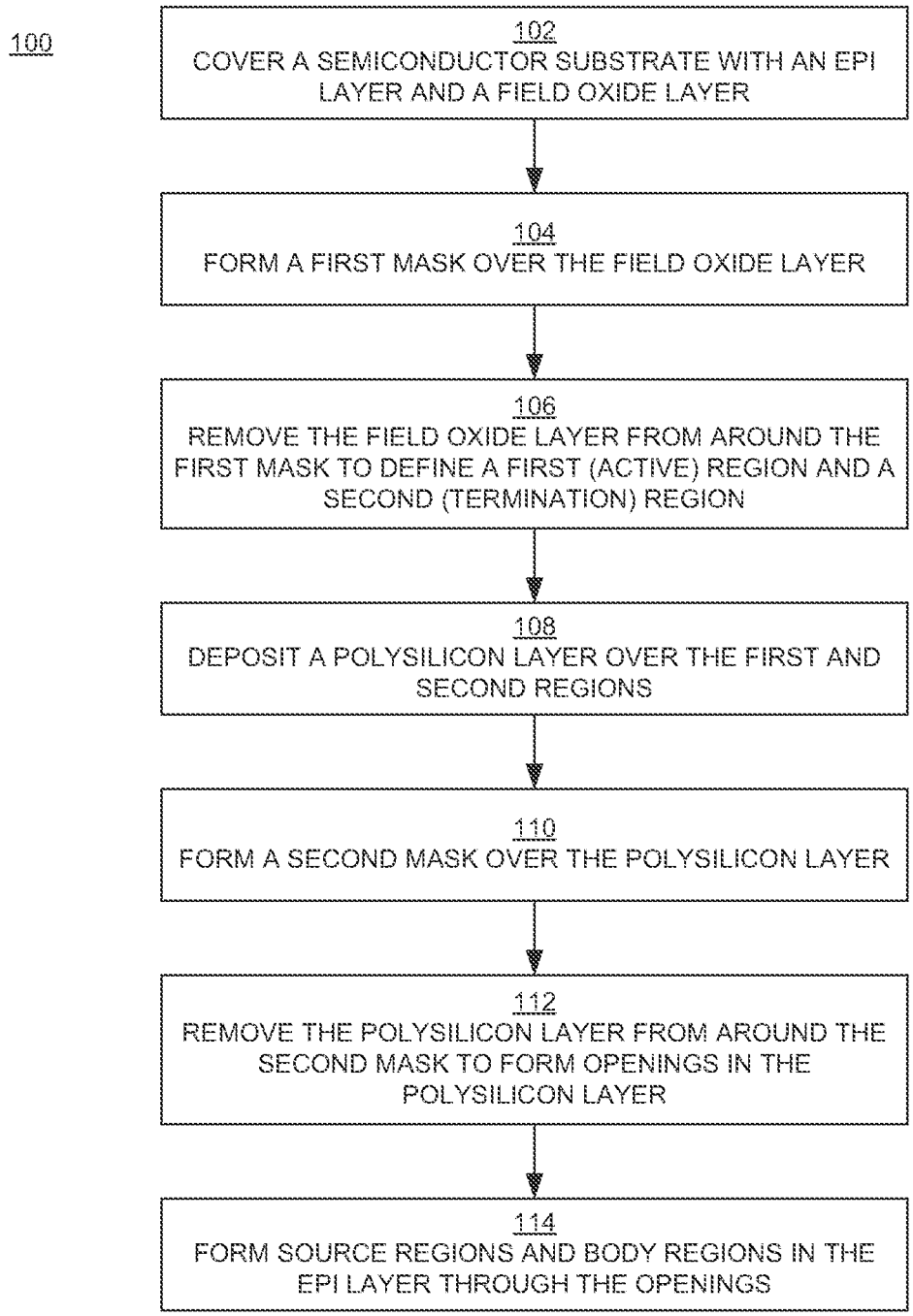
FIGS. 1A, 1B, and 1C are flowcharts showing examples of processes performed in fabricating a MISFET in an embodiment according to the present invention.
Figure 1B:
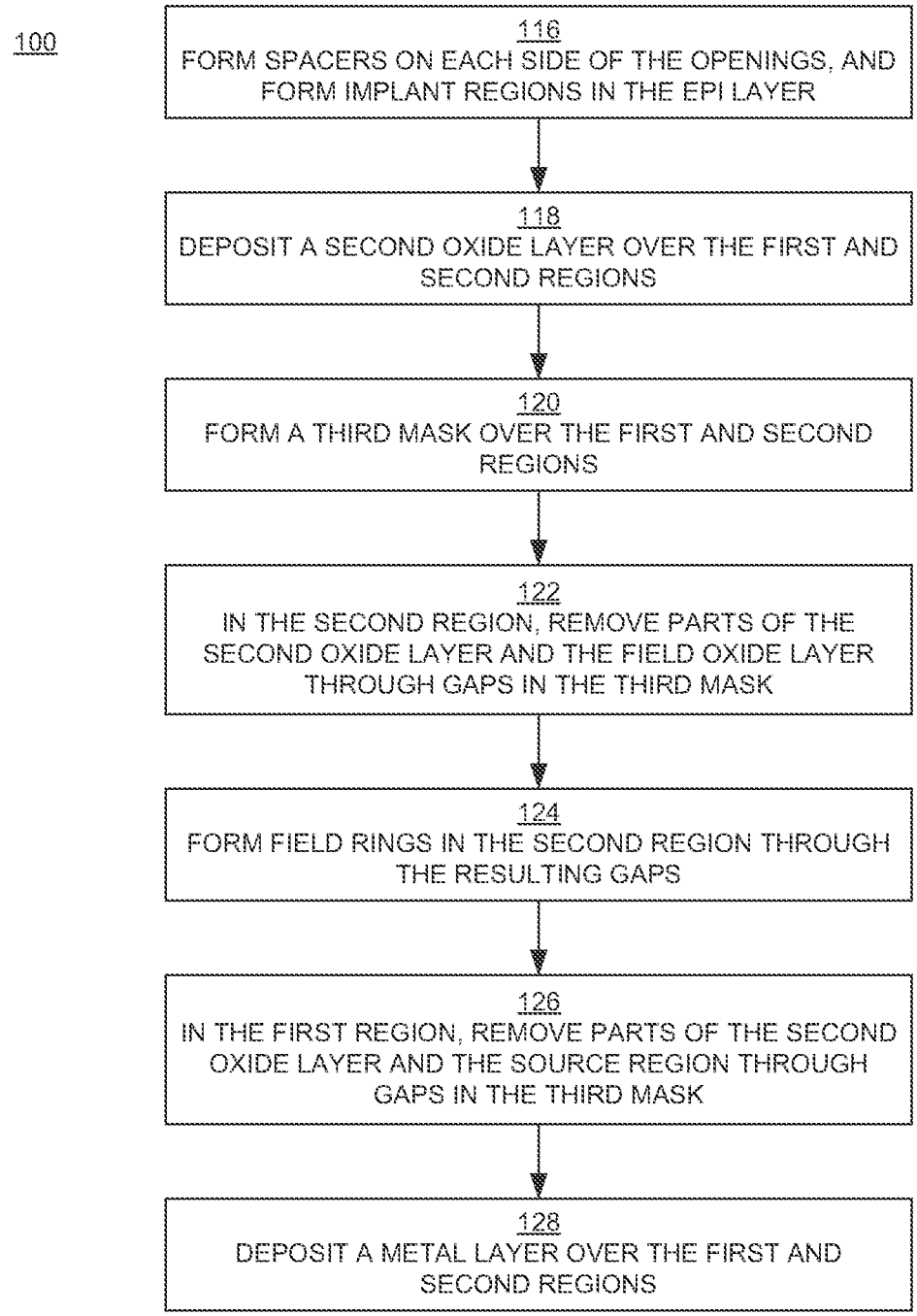
Figure 1C:
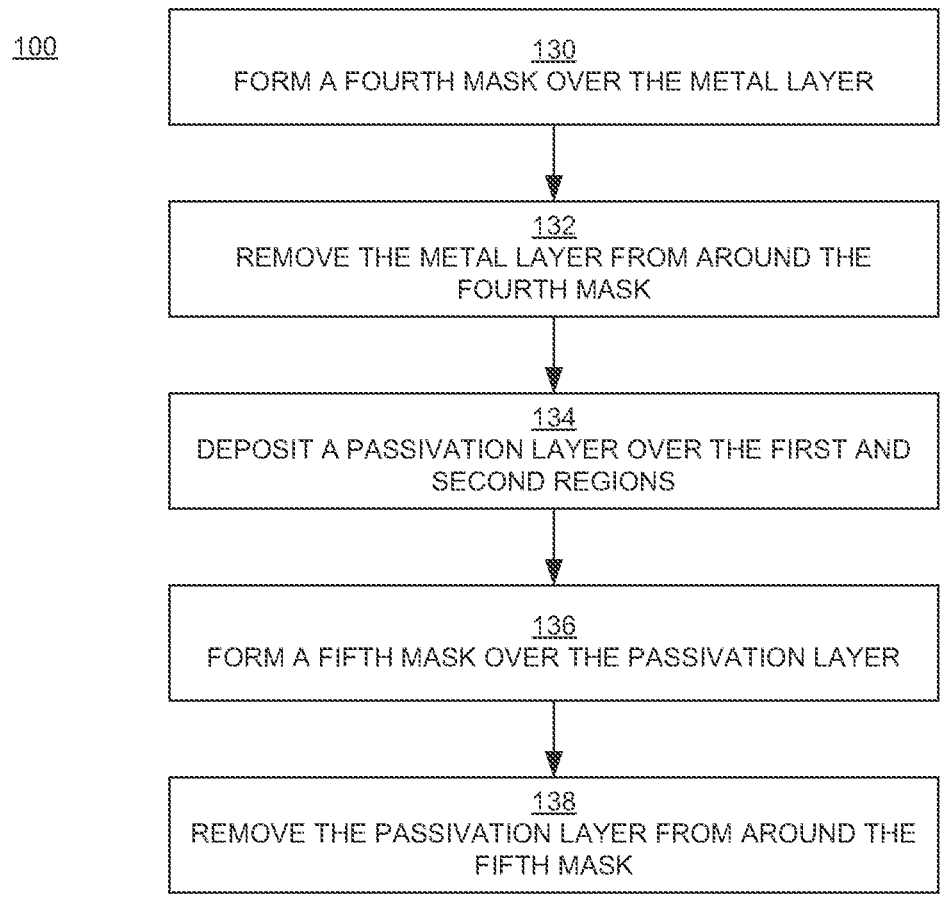

FIGS. 1A, 1B, and 1C illustrate a flowchart 100 of processes for fabricating a device (e.g., an n-channel MISFET) in an embodiment according to the present invention. As mentioned above, although the flowchart 100 is described using an n-channel device as an example, the processes can be readily adapted to manufacture a p-channel device. Also, other fabrication processes and steps may be performed along with the processes and steps discussed herein; that is, there may be a number of process steps before, in between and/or after the steps shown and described herein. Generally speaking, embodiments according to the present invention can replace portions of a conventional fabrication process without significantly affecting peripheral processes and steps.

Figure 2:
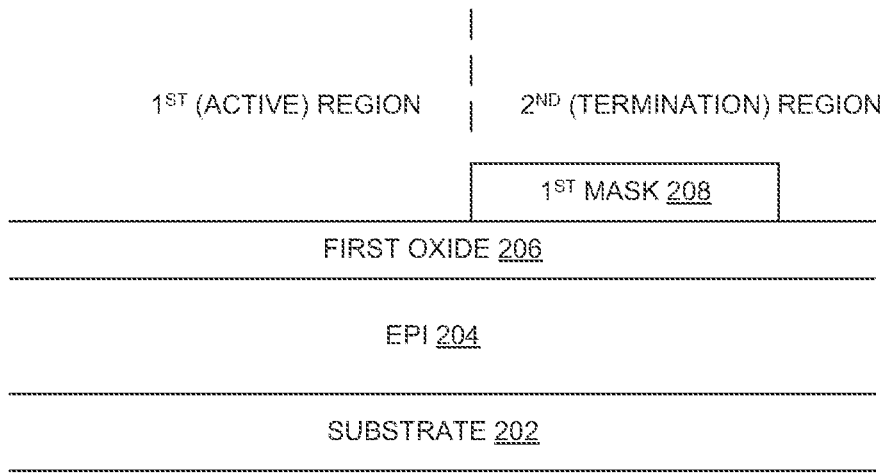
FIGS. 2, 3, 4, 5, 6, 7, 8, 9, and 10 are cross-sectional views of a portion of a MISFET at various points during fabrication in an embodiment according to the present invention.

In block 102, with reference also to FIG. 2, a semiconductor substrate 202 with an n-type epitaxial (epi) layer 204 is covered by a field oxide layer 206. The field oxide layer 206 may also be referred to herein as a first oxide layer. The thickness and doping profile of the epi layer 204 is specified by design to have a given breakdown voltage, particularly a breakdown voltage for a high voltage device.

In block 104, a first mask 208 is formed over the field oxide layer 206. The first mask 208 is used to define a region (which may be referred to herein as the first region) that corresponds to the active region of the device, and also defines a region (which may be referred to herein as the second region) that corresponds to the termination region of the device.

Figure 3:
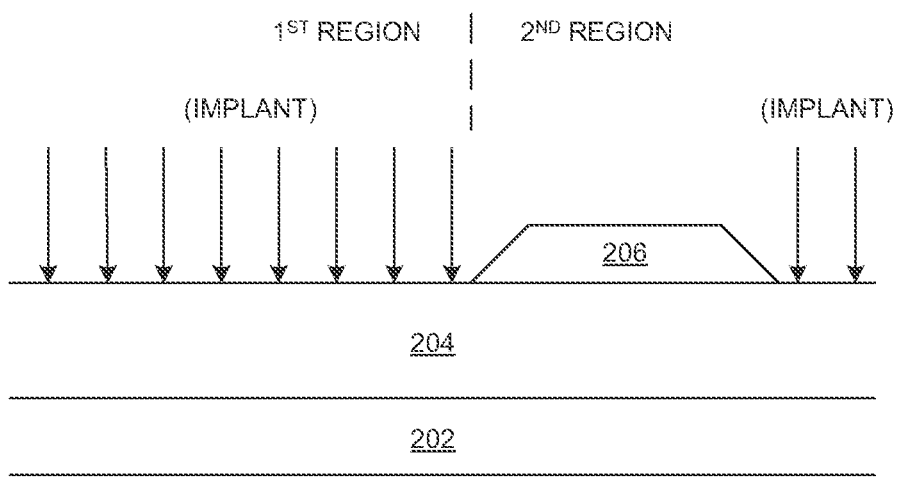

In block 106 of FIG. 1A, with reference also to FIG. 3, the field oxide layer 206 is removed from around the first mask 208, thereby defining the first (active) region and the second (termination) region. The field oxide layer 206 remains in the second region. The first mask 208 can then be removed.

An n-type dopant can then be implanted and driven into the first region and into the second region around the remaining field oxide layer 206 as shown in FIG. 3. A high-quality gate oxide layer 409 (FIG. 4) is formed after etching out the oxide formed during the drive and subsequent surface clean.

Figure 4:
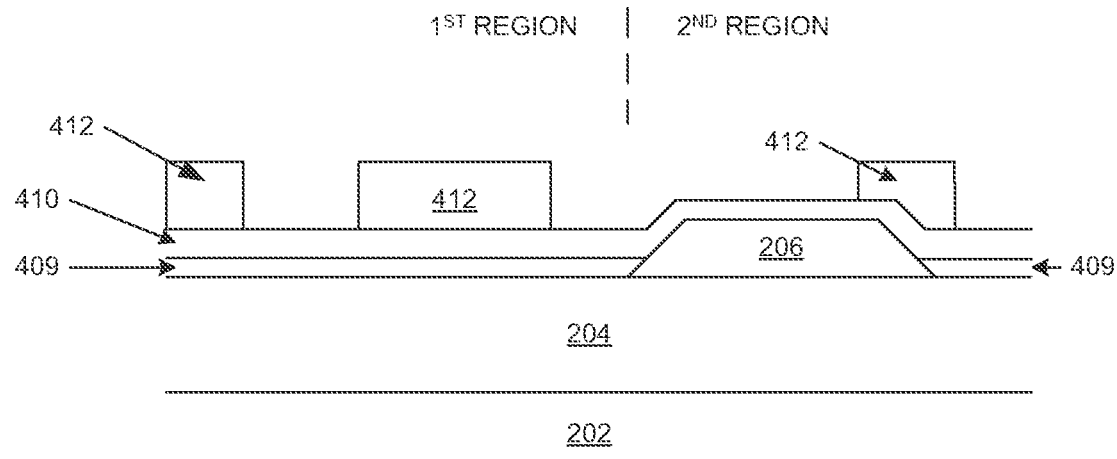

In block 108 of FIG. 1A, with reference also to FIG. 4, a polysilicon layer 410 is deposited over the first and second regions.

In block 110, a second mask 412 is formed over the polysilicon layer 410. The second mask 412 includes a number of mask elements separated by gaps, as shown in FIG. 4.

Figure 5:
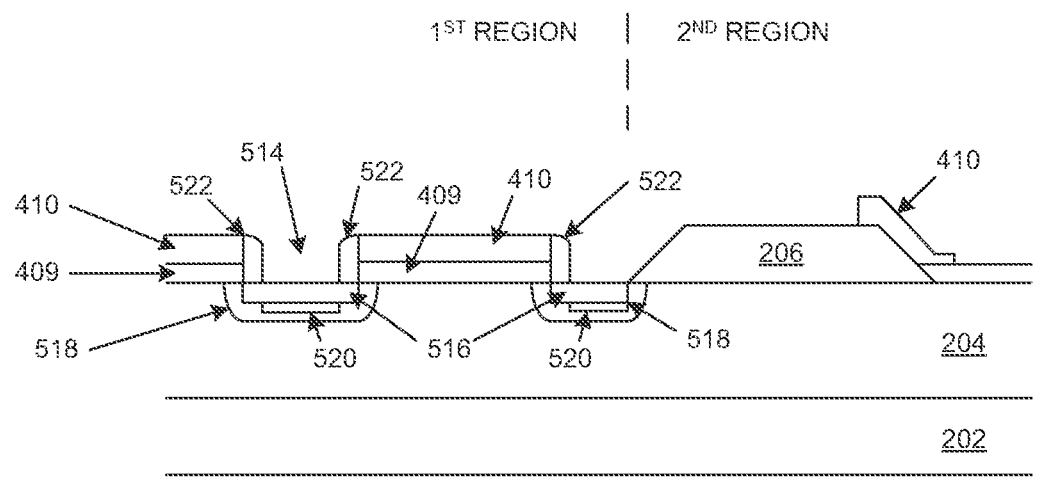

In block 112 of FIG. 1A, with reference also to FIG. 5, the polysilicon layer 410 and the gate oxide layer 409 are removed from around the second mask 412 to form openings (e.g., the opening 514) in the polysilicon layer 410 in the first region, thereby exposing the epitaxial layer 204.

In block 114 of FIG. 1A, an n-type dopant source region 516 and a p-type dopant body region 518 are formed in the epitaxial layer 204 through the opening 514 and other such openings, as shown in FIG. 5. More specifically, in one embodiment, the body region 518 is formed by introducing a p-type dopant (e.g., boron) by ion implantation into the region defined by the opening 514. A succeeding drive completes formation of the body region 518. Next, a shallow n-type dopant (e.g., arsenic) is introduced through the opening 514 to form the source region 516.

In block 116 of FIG. 1B, at this particular point in the process, spacers 522 are formed on each side of the opening 514 by deposition and etch-back of an oxide layer of suitable thickness. As shown in FIG. 5, the spacers are in contact with the polysilicon layer 410 and also in contact with the source region 516. Next, a p-type (p+) dopant implant (e.g., boron) is used to form the implant region 520 below the source region 516, using the spacers 522 to define the boundaries of the implant region 520. The spacers 522 offset the source region 516 and implant region 520 relative to one another and prevent the implant region 520 from diffusing beyond the edge of the source region 516, which would increase the device's threshold voltage.

Figure 6:
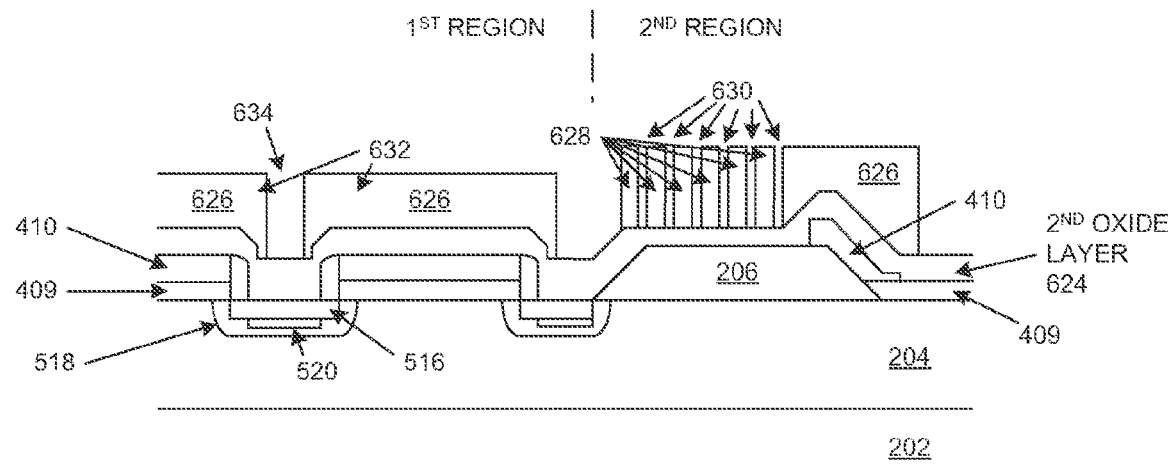

In block 118 of FIG. 1B, with reference also to FIG. 6, after the second mask 412 (FIG. 4) is removed, a second oxide layer 624 (e.g., a low-temperature oxide (LTO) layer) is deposited over the first region and the second region.

In block 120 of FIG. 1B, a third mask 626 is formed over the first region and over the second region. In the second (termination) region, the third mask 626 includes mask elements 628 that are separated by gaps 630.

In one embodiment, the gaps 630 in the third mask 626 are uniformly sized and uniformly spaced. That is, in one embodiment, the width of each of the gaps 630 in the second region is approximately the same (within design and manufacturing tolerances), and the width of each of the mask elements 628 in the second region is approximately the same (within design and manufacturing tolerances). In one such embodiment, each of the gaps 630 is between approximately 0.5 and 0.8 microns in width, and each of the mask elements 628 has a width of approximately 1.8 microns.

As described below, the third mask 626 is used to form field rings in the termination region of the device. The field rings, and hence the mask elements 628 and gaps 630, do not have to be uniformly sized and spaced. In general, the dimensions (width and spacing) of the mask elements 628 and gaps 630 are chosen so that the field rings are formed close enough to each other to allow depletion to proceed laterally from the active region to the field ring closest to the active region, then to the next closest field ring, and so on.

Figure 7:
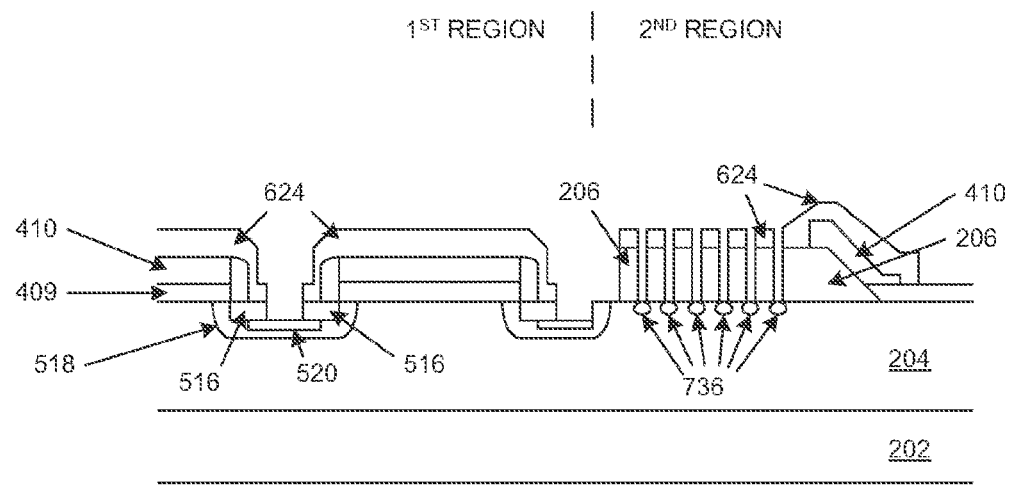

In block 122 of FIG. 1B, with reference to FIG. 7, parts of the second oxide layer 624 in the second region and parts of the field oxide layer 206 in the second region that are exposed through the gaps 630 are removed, thereby exposing the epitaxial layer 204 in the second region through those gaps.

In block 124, a p-type dopant is deposited (e.g., implanted and driven) into the epitaxial layer 204 in the second region through the resulting gaps in the field oxide layer 206 and the second oxide layer 624 (corresponding to the gaps 630), thereby forming field rings 736 for the MISFET. The field rings 736 can be formed in this manner before or after the third mask is removed. The p-type implant-and-drive is chosen so as to obtain a field ring junction depth that achieves the specified breakdown voltage for the high-voltage device. In one embodiment, a metal field plate (not shown) is connected to each field ring (e.g., there is a field plate per field ring).

In one embodiment, based on the mask dimensions mentioned above, the width of each of the field rings 736 is about the same as the width of the gaps 630, and are separated from each other by a distance about the same as the width of the mask elements 628. As mentioned above, the field rings 736 do not have to be uniformly sized and spaced.

With reference back to FIG. 6, the third mask 626 also includes mask elements 632 over the first region. The mask elements 632 are separated by gaps (e.g., the gap 634) that are critically aligned to the openings in the polysilicon layer 410 (e.g., the opening 514 of FIG. 5) in the first region.

In block 126 of FIG. 1B, parts of the second oxide layer 624 and the source region 516 in the first region that are exposed through the gaps (e.g., the gap 634) are removed, thereby also exposing the implant region 520 as shown in FIG. 7.

Figure 8:
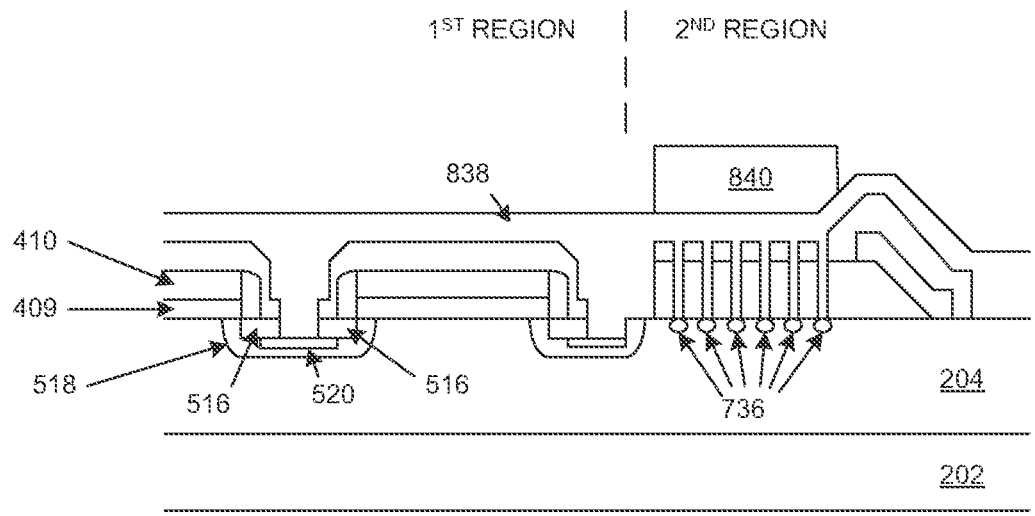

In block 128 of FIG. 1B, with reference to FIG. 8, after the third mask 626 (FIG. 6) is removed, a metal layer 838 is deposited over the first region and the second region, in contact with the source region 516 and the implant region 520.

In block 130 of FIG. 1C, a fourth mask 840 is formed over the metal layer 838.

Figure 9:
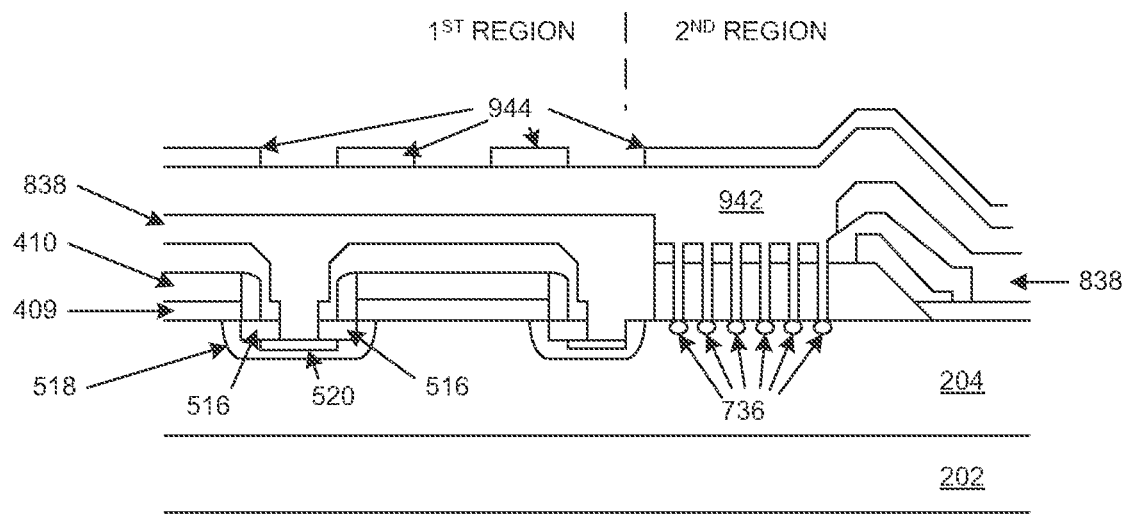

In block 132 of FIG. 1C, with reference also to FIG. 9, the metal layer 838 is removed from areas around the fourth mask 840.

In block 134, after the fourth mask 840 is removed, a passivation layer 942 is deposited over the first region and the second region. In the second region, the passivation layer 942 extends into the gaps between the remaining portions of the first oxide layer 206 and the second oxide layer 624, above the field rings 736.

In block 136, a fifth mask 944 is formed over the passivation layer 942.

Figure 10:
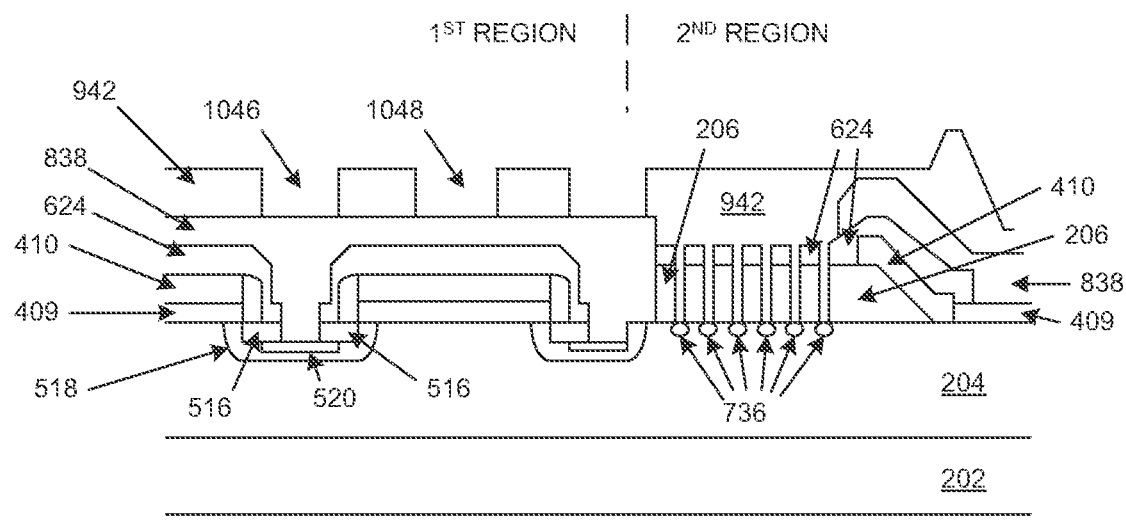

In block 138 of FIG. 1C, with reference also to FIG. 10, the passivation layer 942 is removed from around the fifth mask to form source bond pad regions (e.g., the region 1046) and gate bond pad regions (e.g., the region 1048) for the device.

Thus, in embodiments according to the present invention, a high-voltage MISFET (e.g., MOSFET) can be manufactured using only five masks: the masks of block 104 (the active mask 208), block 110 (the poly mask 412), block 120 (the contact mask 626), block 130 (the metal mask 840), and block 136 (the passivation mask 944), used in that order.

Relative to conventional processes, the number of masks is reduced, from six masks to five masks, thus reducing manufacturing costs and increasing yield.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A process used in fabricating a metal-insulator-semiconductor field-effect transistor (MISFET), said process comprising:

depositing a second oxide layer over a first region and a second region of a structure, said second region comprising a first oxide layer between said second oxide layer and an epitaxial layer, said first region having formed therein a first-type dopant source region, a second-type dopant body region, and a second-type dopant implant region, said first region corresponding to an active region of said MISFET and said second region corresponding to a termination region of said MISFET;

forming a mask over said second region, said mask comprising a first plurality of mask elements separated by gaps, said mask further comprising a second plurality of mask elements over said first region, said mask elements in said second plurality separated by a gap;

removing parts of said second oxide layer and said first oxide layer in said second region that are exposed through said gaps in said first plurality of mask elements, thereby exposing said epitaxial layer, and removing parts of said second oxide layer and said first-type dopant source region in said first region that are exposed through said gap in said second plurality of mask elements, thereby exposing said second-type dopant implant region;

depositing second-type dopant into said epitaxial layer through openings formed in said second region by said removing parts of said second oxide layer and said first oxide layer in said second region, thereby forming field rings for said MISFET;

forming a metal layer in contact with said first-type dopant source region and said second-type dopant implant region in said first region; and forming a passivation layer over said first and second regions, said passivation layer extending into said openings in said second region formed by said removing parts of said second oxide layer and said first oxide layer in said second region.

2. The process of claim 1, wherein said forming said metal layer comprises:

depositing metal over said first and second regions after said exposing said second-type dopant implant region;

forming a second mask over said metal; and removing said metal from areas around said second mask to form said metal layer in contact with said first-type dopant source region and said second-type dopant implant region.

3. The process of claim 1, further comprising, prior to said depositing said second oxide layer:

depositing a polysilicon layer over at least said first region;

removing a portion of said polysilicon layer to expose an area of said first region in which said first-type dopant source region, said second-type dopant body region, and said second-type dopant implant region are subsequently formed; and after forming said first-type dopant source region and said second-type dopant body region, and before forming said second-type dopant implant region, forming a spacer in contact with a remaining portion of said polysilicon layer and also in contact with said first-type dopant source region.

4. The process of claim 1, wherein said gaps are uniformly sized and uniformly spaced.

5. The process of claim 1, wherein each of said gaps is between approximately 0.5 and 0.8 microns in width, and wherein each of said mask elements has a width of approximately 1.8 microns.

6. The MISFET fabricated by the process of claim 1.

7. A method for fabricating a metal-insulator-semiconductor field-effect transistor (MISFET), said method comprising:
    depositing a first oxide layer over an epitaxial layer of a structure;
    forming a first mask over said first oxide layer, said first mask defining a second region corresponding to a termination region of said MISFET, said first oxide layer removed from around said first mask to define a first region corresponding to an active region of said MISFET;
    after removing said first mask, depositing a polysilicon layer over said first region and said second region;
    forming a second mask over said polysilicon layer, said polysilicon layer removed from around said second mask to form an opening in said polysilicon layer in said first region, thereby exposing said epitaxial layer, wherein a first-type dopant source region, a second-type dopant body region, and a second-type dopant implant region are formed in said epitaxial layer through said opening;
    after said second mask is removed, depositing a second oxide layer over said first region and said second region;
    forming a third mask over said second region, said third mask comprising a first plurality of mask elements separated by gaps, wherein parts of said second oxide layer and said first oxide layer that are exposed through said gaps are removed, thereby exposing said epitaxial layer, wherein further second-type dopant is deposited into said epitaxial layer through openings formed by removing said parts of said second oxide layer and said first oxide layer, thereby forming field rings for said MISFET;
    after said third mask is removed, depositing a metal layer over said first region and said second region;
    forming a fourth mask over said metal layer, said metal layer removed from areas around said fourth mask;
    after said fourth mask is removed, depositing a passivation layer over said first region and said second region; and
    forming a fifth mask over said passivation layer, said passivation layer removed from around said fifth mask to form source and gate bond pad regions for said MISFET.

8. The method of claim 7, wherein said third mask further comprises a second plurality of mask elements over said first region, said mask elements in said second plurality separated by a gap, said method further comprising removing parts of said second oxide layer and said first-type dopant source region that are exposed through said gap, thereby also exposing said second-type dopant implant region.

9. The method of claim 7, further comprising, after forming said first-type dopant source region and said second-type dopant body region, and before forming said second-type dopant implant region, forming spacers on each side of said opening, said spacers in contact with a remaining portion of said polysilicon layer and also in contact with said first-type dopant source region.

10. The method of claim 7, wherein said gaps in said third mask are uniformly sized and uniformly spaced.

11. The method of claim 7, wherein each of said gaps in said third mask is between approximately 0.5 and 0.8 microns in width, and wherein each of said mask elements has a width of approximately 1.8 microns.

12. The MISFET fabricated by the process of claim 7.

13. A method for fabricating a metal-insulator-semiconductor field-effect transistor (MISFET), said method comprising:
    removing a first oxide layer of a structure from around a first mask to define a first region corresponding to an active region of said MISFET and to expose an epitaxial layer underlying said first oxide layer, said first mask covering a second region corresponding to a termination region of said MISFET;
    after removing said first mask and depositing a polysilicon layer over said first and second regions, removing said polysilicon layer from an area in said first region that is not covered by a second mask, thereby forming an opening in said polysilicon layer and exposing said epitaxial layer, wherein a first-type dopant source region, a second-type dopant body region, and a second-type dopant implant region are formed in said epitaxial layer through said opening;
    after removing said second mask and depositing a second oxide layer over said first and second regions, removing said first oxide layer and said second oxide layer from areas in said second region that are exposed through gaps in a third mask, thereby exposing said epitaxial layer in said second region, wherein further second-type dopant is deposited into said epitaxial layer in said second region through openings formed by said removing said first oxide layer and said second oxide layer from areas in said second region, thereby forming field rings for said MISFET;
    after removing said third mask and depositing a metal layer over said first and second regions, removing said metal layer from around a fourth mask; and
    after removing said fourth mask and depositing a passivation layer over said first and second regions, removing said passivation layer from around a fifth mask to form source and gate bond pad regions for said MISFET.

14. The method of claim 13, further comprising removing parts of said second oxide layer and said first-type dopant source region that are exposed through a gap in said third mask over said first region, thereby also exposing said second-type dopant implant region.

15. The method of claim 13, further comprising, after forming said first-type dopant source region and said second-type dopant body region, and before forming said second-type dopant implant region, forming spacers on each side of said opening, said spacers in contact with a remaining portion of said polysilicon layer and also in contact with said first-type dopant source region.

16. The method of claim 13, wherein said gaps in said third mask are uniformly sized and uniformly spaced.

17. The method of claim 13, wherein each of said gaps in said third mask is between approximately 0.5 and 0.8 microns in width, and wherein each of said mask elements has a width of approximately 1.8 microns.

18. The MISFET fabricated by the process of claim 13.

* * * * *